(12) United States Patent
Alvarez-Troncoso et al.

(10) Patent No.: US 7,688,022 B2
(45) Date of Patent: Mar. 30, 2010

(54) ENERGY MANAGEMENT SYSTEM FOR A VEHICLE

(75) Inventors: Ignacio Alvarez-Troncoso, Valls (ES); Josep Maria Roset, Valls (ES)

(73) Assignee: Lear Corporation, Southfield, MI (US)

(*) Notice: Subject to any disclaimer, the term of this patent is extended or adjusted under 35 U.S.C. 154(b) by 601 days.

(21) Appl. No.: 11/278,883

(22) Filed: Apr. 6, 2006

(65) Prior Publication Data

US 2007/0194747 A1 Aug. 23, 2007

Related U.S. Application Data

(60) Provisional application No. 60/774,681, filed on Feb. 17, 2006.

(51) Int. Cl.
*H02J 7/04* (2006.01)
*H02J 7/00* (2006.01)
*H02J 7/14* (2006.01)

(52) U.S. Cl. .................. 320/104; 320/134; 320/136; 320/137

(58) Field of Classification Search .............. 320/104, 320/103, 134, 136, 135, 152, 162, 159, 148
See application file for complete search history.

(56) References Cited

U.S. PATENT DOCUMENTS

| | | | |
|---|---|---|---|
| 4,470,654 A | 9/1984 | Friedman | |
| 4,572,878 A | 2/1986 | Daugherty | |
| 4,675,255 A | 6/1987 | Pfeifer et al. | |
| 5,179,340 A | 1/1993 | Rogers | |
| 5,218,288 A | 6/1993 | Mickal et al. | |
| 5,606,242 A | 2/1997 | Hull et al. | |
| 5,629,680 A | 5/1997 | Makhija | |
| 5,645,448 A | 7/1997 | Hill | |
| 5,877,563 A | 3/1999 | Krappel et al. | |
| 5,903,154 A | 5/1999 | Zhang et al. | |
| 5,939,855 A * | 8/1999 | Proctor et al. | 320/104 |
| 5,939,861 A | 8/1999 | Joko et al. | |
| 6,001,506 A | 12/1999 | Timmons et al. | |
| 6,034,521 A | 3/2000 | Eckardt | |
| 6,218,805 B1 | 4/2001 | Melcher | |
| 6,285,191 B1 | 9/2001 | Gollomp et al. | |
| 6,304,062 B1 | 10/2001 | Batson | |

(Continued)

FOREIGN PATENT DOCUMENTS

DE 2142860 3/1973

(Continued)

*Primary Examiner*—Edward Tso
*Assistant Examiner*—Alexis Boateng
(74) *Attorney, Agent, or Firm*—Brooks Kushman P.C.

(57) ABSTRACT

An energy management system and method for a vehicle monitors the state and/or condition of at least one energy storage device. A connection element is included that is adapted to connect to a first terminal of the energy storage device. A terminal body is included having a terminal connection point configured to connect to a second terminal of the energy storage device. At least one electrical shunt is also coupled to the terminal body and the connection element wherein the electrical shunt provides a path for the flow of current from the terminal connection point to the connection element. This system further includes an electrical circuit coupled to the shunt that is configured to determine predetermined parameters of the energy storage device based on the flow of current through the electrical shunt.

20 Claims, 3 Drawing Sheets

U.S. PATENT DOCUMENTS

| | | |
|---|---|---|
| 6,331,762 B1 | 12/2001 | Bertness |
| 6,489,693 B1 | 12/2002 | Hetzler |
| 6,551,147 B2 | 4/2003 | Wakata et al. |
| 6,573,723 B2 | 6/2003 | Baston |
| 6,628,102 B2 | 9/2003 | Batson |
| 6,633,165 B2 | 10/2003 | Bertness |
| 6,787,935 B2 | 9/2004 | Heim |
| 6,805,090 B2 | 10/2004 | Bertness et al. |
| 6,850,037 B2 | 2/2005 | Bertness |
| 6,876,174 B1 | 4/2005 | Samittier Marti et al. |
| 6,901,350 B2 | 5/2005 | Loehr et al. |
| 6,909,287 B2 | 6/2005 | Bertness |
| 6,943,455 B1 | 9/2005 | Maxwell |
| 7,012,404 B2 | 3/2006 | Batson |
| 7,039,533 B2 | 5/2006 | Bertness et al. |
| 7,081,755 B2 | 7/2006 | Klang et al. |
| 7,164,272 B1 | 1/2007 | Borrego Bel et al. |
| 7,170,295 B2 | 1/2007 | Hetzler |
| 7,405,570 B2 | 7/2008 | Hirthammer |
| 2001/0023037 A1 | 9/2001 | Kieninger et al. |
| 2001/0033171 A1 | 10/2001 | Batson |
| 2002/0180405 A1 | 12/2002 | Batson |
| 2002/0182493 A1 | 12/2002 | Ovshinsky et al. |
| 2003/0038637 A1 | 2/2003 | Bertness et al. |
| 2003/0057770 A1 | 3/2003 | Heim |
| 2003/0141844 A1 | 7/2003 | Fiebig et al. |
| 2003/0203681 A1 | 10/2003 | Liang |
| 2003/0232546 A1 | 12/2003 | Davis |
| 2003/0236033 A1 | 12/2003 | Freitag |
| 2004/0012396 A1* | 1/2004 | Batson ............... 324/444 |
| 2004/0048142 A1 | 3/2004 | Marusak et al. |
| 2004/0056634 A1 | 3/2004 | Seils et al. |
| 2004/0087219 A1 | 5/2004 | Freitag |
| 2004/0212342 A1 | 10/2004 | Batson |
| 2004/0232918 A1 | 11/2004 | Bertness et al. |
| 2005/0014408 A1 | 1/2005 | Swiatek et al. |
| 2005/0035737 A1 | 2/2005 | Elder et al. |
| 2005/0058892 A1 | 3/2005 | Ovshinsky et al. |
| 2005/0101197 A1 | 5/2005 | Wirth |
| 2005/0190519 A1 | 9/2005 | Brown et al. |
| 2005/0202731 A1 | 9/2005 | Brito |
| 2005/0264296 A1 | 12/2005 | Philbrook |
| 2006/0003627 A1 | 1/2006 | Freitag |
| 2006/0057899 A1 | 3/2006 | Tokunaga |
| 2006/0076466 A1 | 4/2006 | Serra |
| 2008/0238431 A1 | 10/2008 | Schimmel |
| 2009/0195252 A1 | 8/2009 | Kerbel |
| 2009/0212779 A1 | 8/2009 | Wenger |
| 2009/0224768 A1 | 9/2009 | Dollansky et al. |

FOREIGN PATENT DOCUMENTS

| | | |
|---|---|---|
| DE | 2623807 A1 | 12/1977 |
| DE | 2842817 B1 | 5/1979 |
| DE | 3532044 A1 | 3/1987 |
| DE | 4429633 A1 | 2/1996 |
| DE | 19517709 C1 | 11/1996 |
| DE | 19961311 A1 | 7/2001 |
| DE | 10031243 A1 | 1/2002 |
| DE | 10039472 A1 | 2/2002 |
| DE | 10118027 A1 | 11/2002 |
| DE | 10118051 A1 | 11/2002 |
| DE | 10116925 C1 | 1/2003 |
| DE | 10203512 A1 | 8/2003 |
| DE | 10332410 B3 | 5/2004 |
| DE | 20320473 U1 | 10/2004 |
| DE | 10333035 A1 | 2/2005 |
| DE | 10343179 A1 | 4/2005 |
| DE | 10347111 A1 | 5/2005 |
| DE | 10352266 A1 | 6/2005 |
| DE | 10354080 A1 | 6/2005 |
| DE | 102004004172 A1 | 8/2005 |
| DE | 102004007851 A1 | 9/2005 |
| DE | 102004013817 A1 | 10/2005 |
| DE | 102004046855 B3 | 4/2006 |
| DE | 102004049153 A1 | 4/2006 |
| DE | 102004049251 A1 | 4/2006 |
| DE | 102004051489 A1 | 5/2006 |
| DE | 102004053647 A1 | 5/2006 |
| DE | 102004053648 A1 | 5/2006 |
| DE | 102004053650 A1 | 5/2006 |
| DE | 102004055848 A1 | 5/2006 |
| DE | 102004055847 A1 | 6/2006 |
| DE | 102004055849 A1 | 6/2006 |
| DE | 102005003577 A1 | 8/2006 |
| DE | 202005013773 U1 | 8/2006 |
| DE | 102005041881 A1 | 9/2006 |
| DE | 102005041392 A1 | 10/2006 |
| DE | 102005019569 A1 | 11/2006 |
| DE | 102005021959 A1 | 11/2006 |
| DE | 102005032227 A1 | 1/2007 |
| EP | 0560468 A1 | 2/1993 |
| EP | 0725412 A2 | 8/1996 |
| EP | 0743736 A1 | 11/1996 |
| EP | 0438537 B1 | 12/1996 |
| EP | 1411364 A1 | 4/2004 |
| EP | 1238288 B1 | 7/2004 |
| EP | 1435424 A1 | 7/2004 |
| EP | 1621892 A1 | 2/2006 |
| EP | 1632781 A1 | 3/2006 |
| EP | 1632782 A1 | 3/2006 |
| EP | 0448745 A1 | 3/2007 |
| EP | 1828786 B1 | 7/2009 |
| FR | 2208117 | 6/1974 |
| FR | 2826744 A1 | 6/2002 |
| FR | 2879751 A1 | 6/2006 |
| GB | 2388975 A | 11/2003 |
| WO | 9114600 A1 | 10/1991 |
| WO | 9633078 A1 | 10/1996 |
| WO | 9954744 A1 | 10/1999 |
| WO | 0127641 A1 | 4/2001 |
| WO | 0131718 A2 | 5/2001 |
| WO | 0214887 A1 | 2/2002 |
| WO | 02054096 A1 | 7/2002 |
| WO | 02082617 A1 | 10/2002 |
| WO | 2005008265 A1 | 1/2005 |
| WO | 2006034897 A1 | 4/2006 |

* cited by examiner

ENERGY MANAGEMENT SYSTEM FOR A VEHICLE

CROSS-REFERENCE TO RELATED APPLICATIONS

This application claims the benefit of U.S. provisional application Ser. No. 60/774,681 filed Feb. 17, 2006.

TECHNICAL FIELD

The present invention relates to a system and method for managing energy within a vehicle.

BACKGROUND

Vehicles have long been equipped with energy storage devices, such as batteries for powering the vehicle and other devices located thereon. On hybrid-electric vehicles, the battery is commonly used to provide motive force to the vehicle. As such, in both non-hybrid and hybrid vehicles, the state and/or condition of the battery is important. Accordingly, there is a need for a system capable of sensing and monitoring the condition of an energy storage device for optimal vehicle energy management.

SUMMARY

The present invention includes an energy management system and method for a vehicle having at least one energy storage device. The system includes a connection element adapted to connect to a first terminal of the energy storage device. A terminal body is included having a terminal connection point configured to connect to a second terminal of the energy storage device. At least one electrical shunt is also coupled to the terminal body and the connection element wherein the electrical shunt provides a path for the flow of current from the terminal connection point to the connection element. The system further includes an electrical circuit coupled to the shunt that is configured to determine predetermined parameters of the energy storage device based on the flow of current through the electrical shunt.

BRIEF DESCRIPTION OF DRAWINGS

The features of the present invention which are believed to be novel are set forth with particularity in the appended claims. The present invention, both as to its organization and manner of operation, together with further objects and advantages thereof, may be best understood with reference to the following description, taken in connection with the accompanying drawings in which:

DETAILED DESCRIPTION OF THE EMBODIMENTS

Figure 1A:
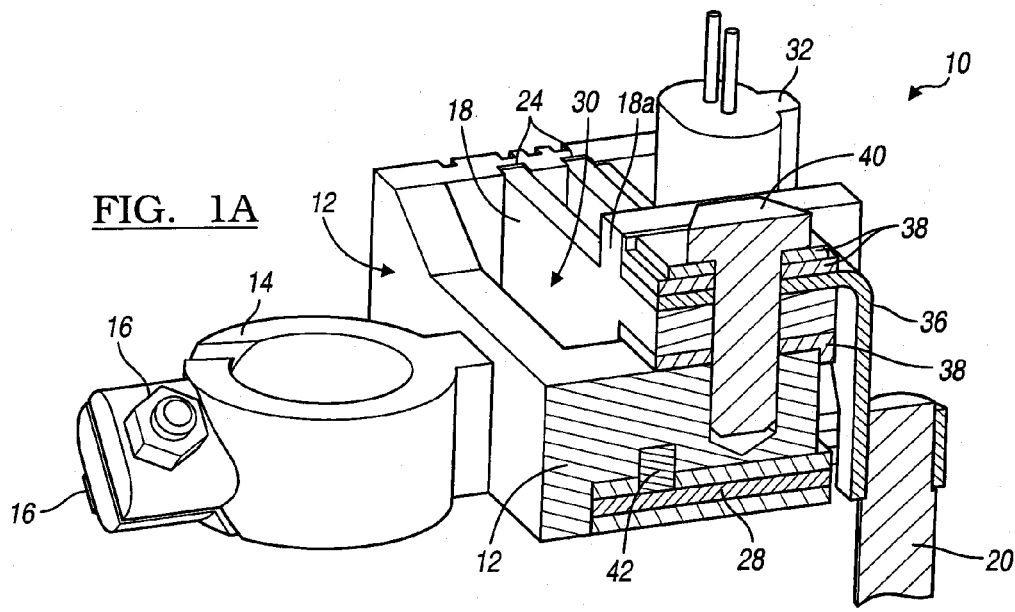
FIGS. 1A-1E illustrate alternative views of an energy management system in accordance with an embodiment of the present invention.

As required, detailed embodiments of the present invention are disclosed herein. However, it is to be understood that the disclosed embodiments are merely exemplary of the invention that may be embodied in various and alternative forms. The figures are not necessarily to scale, and some features may be exaggerated or minimized to show details of particular components. Therefore, specific functional details disclosed herein are not to be interpreted as limiting, but merely as a representative basis for the claims and/or as a representative basis for teaching one skilled in the art to variously employ in the present invention.

FIGS. 1A-1E illustrate alternative views of an energy management system 10 in accordance with an embodiment of the present invention. The energy management system 10 is configured to sense and monitor various energy storage devices (not shown) including, but not limited to, batteries, capacitors, and the like. Based on the sensing and monitoring of the energy storage device, the energy management system 10 generates signals that indicate the condition and/or state of the energy storage device, which are received by, for example, an electronic module within the vehicle. In one aspect of the invention, the sensing and monitoring via the energy management system 10 enables the control of the energy storage device's charging and discharging.

As shown in FIGS. 1A-1E, the energy management system 10 includes a terminal body 12 having a terminal connection point 14 that enables the terminal body 12 to be connected or attached to the energy storage device (not shown). In the embodiment shown, the terminal connection point 14 includes an aperture that is configured to receive a conductor (not shown), which is coupled to the energy storage device. In one embodiment, the conductor may be a positive or a negative battery post terminal. The terminal connection point 14 also includes a fastening device 16 (e.g., a bolted screw) that enables the aperture to be securely attached to the conductor (not shown). It is recognized that in alternative embodiments the terminal connection point 14 may have a variety of shapes and forms without departing from the scope of the present invention.

In the illustrated embodiment, the terminal connection point 14 is integrally formed with the terminal body 12. As such, the terminal body 12 may be formed by a casting process or by forming stamped sheet metal in accordance with design requirements. The terminal body 12 includes at least one electrical shunt 18 that is electrically coupled to the terminal body 12. In the embodiment shown, two vertical shunts 18 are illustrated which terminate, at one end, at a body portion 18a of the shunts. The shunts 18 allow the flow of current from the terminal connection point 14 to a ground terminal 20 as indicated by a current path arrow 22 in FIG. 1E. The use of multiple shunts 18 improves the thermal dissipation and mechanical robustness of the terminal body 12. Hence, the surface of the shunts 18 may be smooth or include a series of projections for realizing specific thermal dissipation properties. The shunts 18 may be calibrated to possess a predetermined electrical resistance. Accordingly, in one aspect of the invention, the shunts 18 may be calibrated to have substantially the same electrical resistance. The process of calibrating the shunts 18 to possess specific electrical resistances may include eliminating or adding a predetermined material having desired electrical resistance properties to one or all shunts 18.

As shown, the shunts 18 may be positioned within vertical lodgings or notches 24 that are formed on an inner portion 30 of the terminal body 12. Positioning of the shunts 18 within the vertical lodgings or notches 24 also improves the robustness of the system. Furthermore, the shunts 18 may be fixed to the terminal body 12 by a welding process. Additional vertical projections 26 may be formed on an outer portion of the terminal body 12 (FIGS. 1C and 1D) to enhance thermal dissipation of the system. In one embodiment, the surface of the terminal body 12 and shunts 18 may be treated with a nickel-type surface treatment for electrical stability. In alternative embodiments, other surface treatments are applicable such as tin and the like.

The energy management system 10 also includes an electrical circuit 28 that is coupled to the terminal body 12. The electrical circuit 28 is configured to determine and/or sense various operating parameters of the energy storage device. The operating parameters may include, but are not limited to, the battery state of charge (SOC), the battery state of health (SOH), the battery conductance, the remaining charge of the battery, the battery cranking power for the vehicle, and the like. The present invention continuously determines and updates the parameters based on various currents, temperatures, and voltages of the system. In one embodiment, the electrical circuit 28 is formed of a printed circuit board (PCB) and includes at least one controller and other circuitry capable of processing and generating data and signals. In the PCB embodiment, the electrical circuit 28 may be molded within the inner portion 30 of the terminal body 12 and may also include a local interconnect network (LIN) connector 32 (FIG. 1B). The connector 32 enables the transmission of electrical signals to and from the energy management system 10. Alternative embodiments may include other types of connectors 32, including but not limited to, a controller area network (CAN) type connector 32 and the like. Additionally, locating the electrical circuit 28 within the inner portion 30 of the terminal body 12 isolates the PCB from undesirable elements including water, dirt, and the like.

Figure 1B:
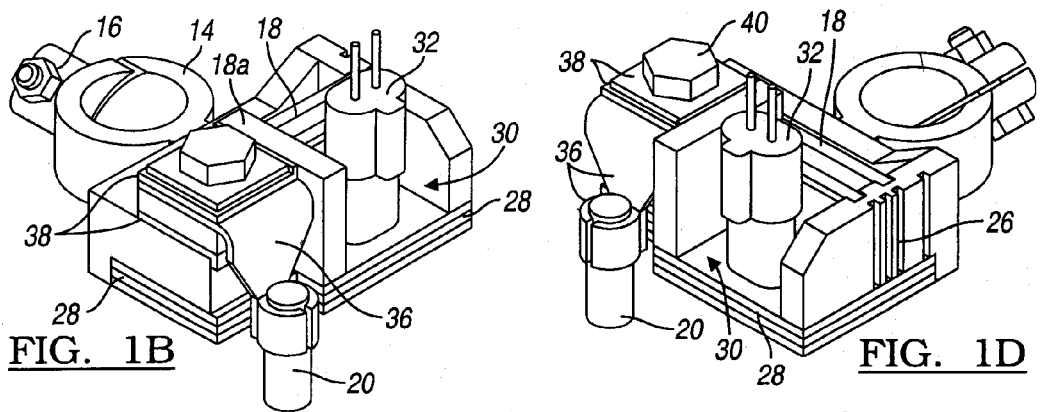
Figure 1D:
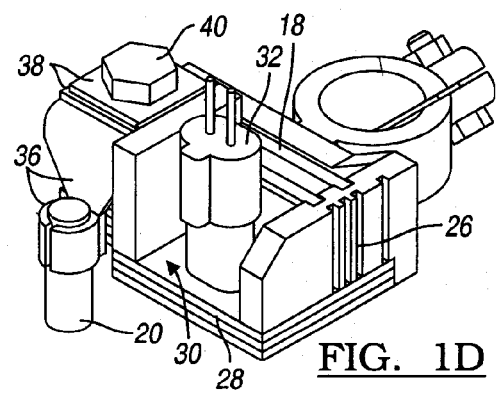
Figure 1C:
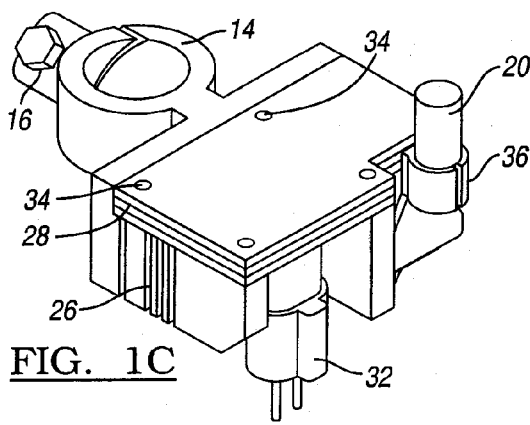
Figure 1E:
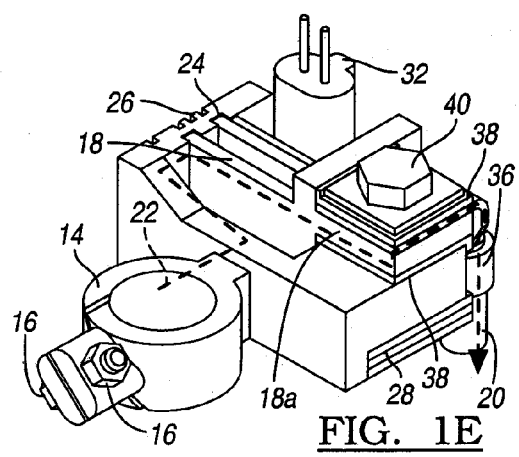

The PCB may be attached to the terminal body 12 by multiple fixing devices 34 as indicated in FIG. 1C. The fixing devices 34 enable the PCB to be electrically coupled to the terminal body 12 and enable the electrical circuit 28 to sense and measure the resistance of the shunts 18. In one embodiment, the fixing devices 34 include four cylindrical pins formed of a conductive material for electrically coupling the electrical circuit 28 to the terminal body 12.

As described in the foregoing, the energy management system 10 includes a ground terminal 20. As shown in FIGS. 1A-1E, the ground terminal 20 is coupled to the energy management system 10 through the use of a bracket 36 (also referred to as a connection element). The bracket 36 is formed in a manner so as to be attached to the ground terminal 20 and be disposed between a separator 38 and the body portion 18a of the shunts 18. The bracket 36 is electrically isolated from the terminal body 12 through the use of the separators 38. In one embodiment, the separators 38 are formed of a non-conductive material such as plastic. The separators 38 cause current to flow from the terminal connection point 14 through the shunts 18, to the bracket 36, and to the ground terminal 20 as shown by the current path arrow 22 in FIG. 1E. Accordingly, in one embodiment, no current flows directly from the terminal connection point 14 through the terminal body 12 to the ground terminal 20.

The bracket 36, the separators 38, and the body portion 18a of the shunts 18 also form a rigid mechanical block that improves the robustness of the energy management system, particularly during vehicle vibrations and pull-outs from the vehicle harness. A fastening device 40 (FIGS. 1A, 1B, 1D, and 1E), such as a screw, secures the ground terminal 20 and the mechanical block formed by the bracket 36, the separators 38, and the body portion 18a of the shunts 18. However, as shown, the fastening device 40 is electrically isolated from the bracket 36 and the body portion 18a through the use of several separators 38.

As illustrated in FIG. 1A, a thermal device 42 is attached to the electrical circuit 28 and contacts the terminal body 12. In one aspect of the invention, the thermal device 42 is a thermal resistor such as a positive temperature coefficient (PTC) type or a negative temperature coefficient (NTC) type device. In response to the temperature of the terminal body 12, the thermal device 42 reacts accordingly. Particularly, upon sensing the temperature of the terminal body 12, the thermal device 42 generates a signal that is received by controller 44 on the PCB, which determines the temperature of the terminal body 12 and the battery.

Figure 2:
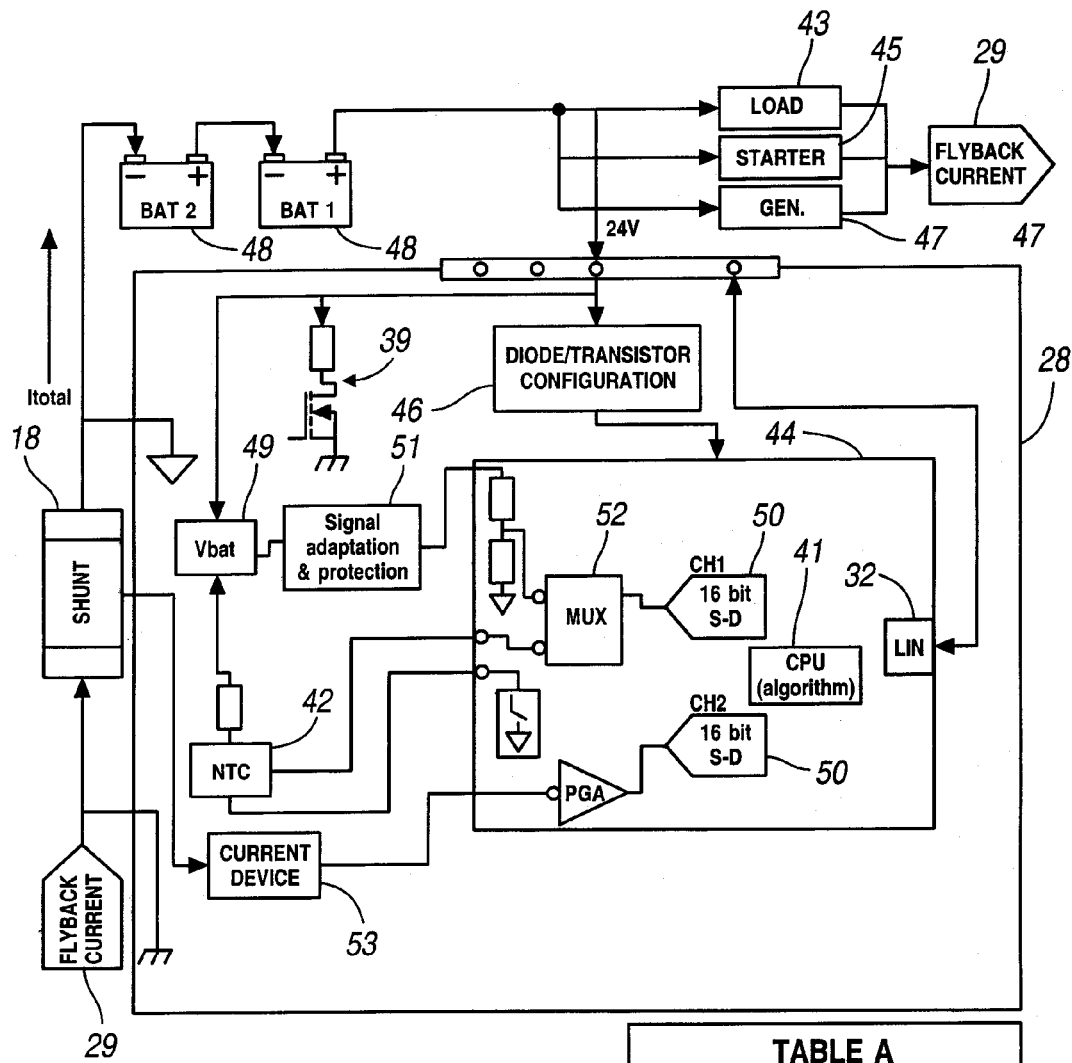
FIGS. 2 and 3 illustrate detailed electrical schematics of alternative embodiments of the energy management system and Tables A and B containing exemplary voltage, current, and temperature parameters in accordance with embodiments of the present invention.
Figure 3:
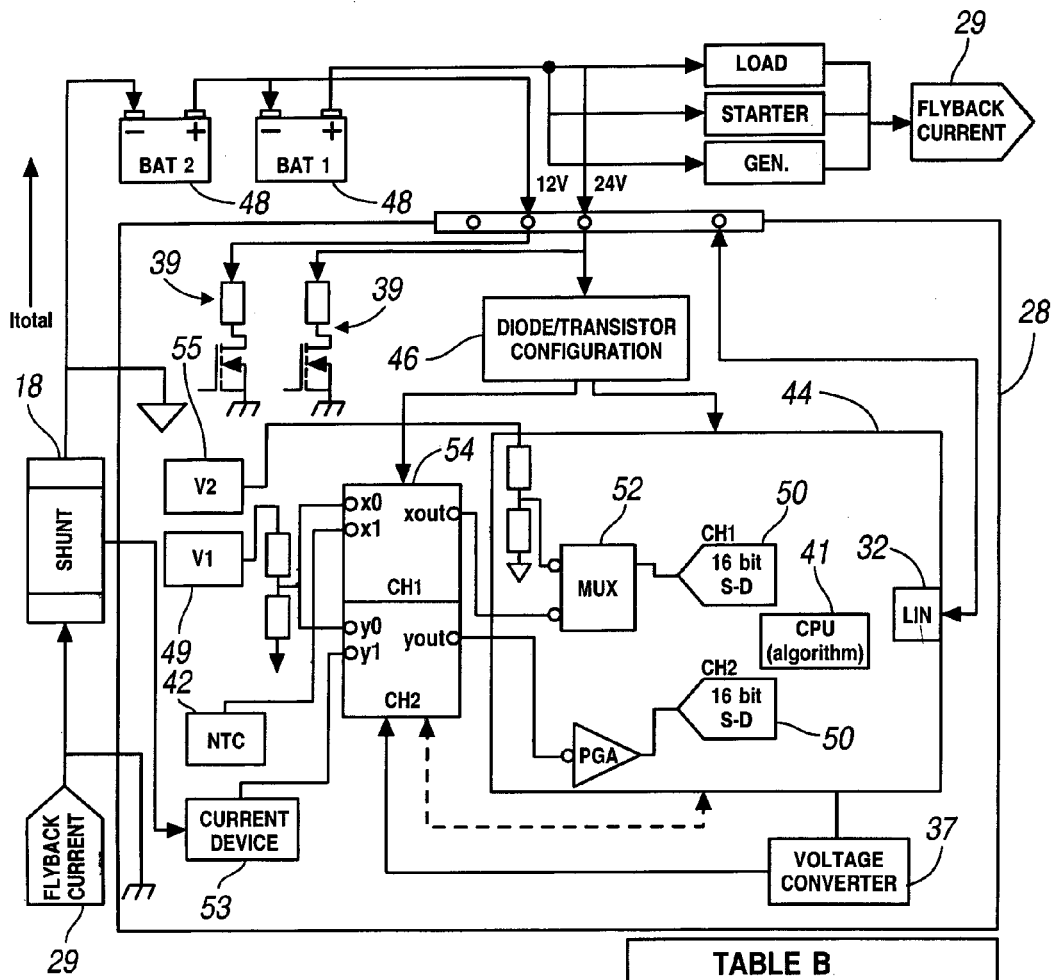

Referring to FIGS. 2 and 3, detailed electrical schematics are provided that illustrate exemplary configurations of the energy management system 10. In the embodiments shown, multiple batteries 48 are included that are coupled to a load 43, a starter 45, and a generator 47 of the vehicle. As shown, the electrical current output from the load 43, starter 45, and generator 47 may be used as a feedback or flyback current 29, which is received by the shunts 18.

The energy management system 10 includes an electrical circuit 28 having a controller 44. Specifically as shown in FIG. 2, this embodiment is configured to receive and process signals from a single voltage system (e.g., 12V, 24V, or 36V voltage system). Alternatively, FIG. 3 illustrates an embodiment where multiple voltage systems are managed (e.g., 12V and 24V voltage systems). In either embodiment, the signals received by the electrical circuit 28 (e.g., PCB) are processed through the use of electronic devices and components that comprise the electrical circuit 28. The electrical circuit 28 includes a configuration of diodes and transistors 46 that protect the electronics from undesirable voltage and current. Once the signals pass through the diode and transistor configuration 46, which is designed to protect the electronics, the signal is received by the controller 44. The controller 44 may have a central processor unit 41 that contains several algorithms for calculating, measuring, and determining the various operating parameters.

Additionally, the electrical circuit 28 includes a voltage device 49 (labeled "Vbat" in FIG. 2) and 55 (labeled "V2" in FIG. 3) that senses the voltage of batteries 48 ("BAT 1" and/or "BAT 2"). A signal adaptation and protection circuit 51 (FIG. 2) is included for receiving and adapting signals from the voltage device 49 for processing by the controller 44. A device 39, which may be a metal-oxide semiconductor field effect transistor (MOSFET), enables the determination of the conductance of batteries 48. The thermal device 42 senses the thermal condition of the terminal body 12 (FIGS. 1A-1E) and generates corresponding signals for the controller 44. A current device 53 senses current from the shunt 18. The current sensed by current device 53 is ultimately received by the controller 44 for processing.

As shown, the connector 32 is coupled to the electrical circuit 28 to enable signals processed by the controller 44 to be transmitted throughout the vehicle. In one embodiment, the connector 32 enables the transmission of signals that correspond to the voltage of the batteries 48, the battery conductance, intermediate voltages, a battery state of charge, the temperature of the battery, the current from the battery, and the like. It is recognized that other types of signals may be transmitted without departing from the scope of the present invention.

The electrical circuit 28 includes multiple sigma delta analog to digital converters 50. In one embodiment, two analog to digital converters 50 are dedicated to a first and a second channel wherein each channel enables simultaneous measurement of various operating parameters.

FIGS. 2 and 3 also include, respectively, Tables A and B that illustrate the various voltage, time, current, and temperature parameters that may be simultaneously measured through the use of the analog to digital converters 50 and other components of electrical circuit 28. Based on the data in Tables A and B, the electrical circuit 28 can determine the various operating parameters including, but not limited to, the battery state of charge (SOC), the battery state of health (SOH), the battery conductance, the remaining charge of the battery, the battery cranking power for the vehicle, and the like. It is recognized that the parameters shown in Tables A and B are for example only and do not serve as a limitation to the scope of the present invention. Particularly, as shown in Table A (FIG. 2), a single digital converter 50 may, for example, be designated as "Channel 1" and indicate the total voltage of the battery 48 ($V_{bat}$ (total)). A second digital converter 50 may, for example, be designated "Channel 2" and indicate the total current ($I_{total}$) passing through the shunt 18. Channel 2 may be designated to indicate the external temperature ($T_{external}$) of the terminal body 12 (FIGS. 1A-1E) via the thermal device 42. Channel 2 may also indicate the amount of time in an "on" mode ($T_{on-chip}$) for the electrical circuit 28. The electrical circuit 28, particularly the controller 44, also includes a multiplexer 52 for receiving multiple signals such as a battery voltage signal, a temperature signal, and the like.

As described above, multiple voltage systems may be managed through the use of the embodiment shown in FIG. 3. Specifically, the embodiment in FIG. 3 illustrates an energy management system 10 having both a 12-volt and a 24-volt voltage system. Accordingly, a logic device 54 is included in the electrical circuit 28 for outputting a corresponding signal to the multiplexer 52 and other circuitry for determining the desired operating parameters. The logic device 54 communicates with the controller 44 and receives signals from the voltage device 49 and the thermal device 42. A voltage sensor 55 (V2) is capable of sensing the voltage of parallel series batteries and any intermediate voltages of the system. In one embodiment, voltage sensor 55 senses the voltage of a single battery 48 (e.g., BAT 2). A voltage converter 37 manipulates voltage inputs to provide a desired voltage for the logic device 54.

Now, referring to Table B of FIG. 3, Channels 1 and 2 may output values corresponding to the voltages of batteries 48 (e.g., $V_{bat2}$ and $V_{bat1}$). Particularly, in Table B, $V_{bat2}$ has substantially the same voltage of voltage sensor 55 (V2). Table B also illustrates, via the present invention, that the sum of the voltages of batteries 48 (i.e., $V_{bat2}+V_{bat1}$) equals the voltage determined by voltage device 49 (V1). Additionally, Channel 2 may indicate the amount of current ($I_{total}$) flowing within the system while Channel 1 indicates the voltage as determined by voltage devices 49 and 55.

Furthermore, via thermal device 42, Channel 1 may indicate the temperature of batteries 48. Accordingly, Table B illustrates that Channel 1 may indicate the temperature of the battery 48 (i.e., $T_{bat2}$), as determined by the thermal device 42. Consequently, Channel 2 may indicate the total amount of current flowing within the system ($I_{total}$) and the voltage (V1) of the battery 48 (i.e., BAT 1). Channel 1 may also indicate the change in voltage (e.g., $\Delta V1$) for the battery 48 (i.e., BAT 1) while Channel 2 indicates the change in the total current (e.g., $\Delta I_{total}$) flowing within the system. Moreover, as shown in Table B, Channel 1 may indicate the change in voltage (e.g., $\Delta V2$) for the battery 48 (i.e., BAT 2) while Channel 2 indicates the change in the total current (e.g., $\Delta I_{total}$) flowing within the system, which may be equal to the change in current flowing through or from the battery 48 (i.e., $\Delta I_{bat2}$). It is recognized that the specific electrical configurations illustrated in FIGS. 2 and 3 are by example only and may depart from the illustrated embodiments without departing from the scope of the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An energy management system for a vehicle having at least one energy storage device, the system comprising:
    a connection element adapted to connect to a first terminal of the energy storage device;
    a terminal body having a terminal connection point configured to connect to a second terminal of the energy storage device;
    at least one electrical shunt coupled to the terminal body and the connection element, the electrical shunt providing a path for the flow of current from the terminal connection point to the connection element;
    an electrical circuit coupled to the shunt, the electrical circuit being configured to determine predetermined parameters of the energy storage device based on the flow of current through the electrical shunt; and
    wherein the at least one shunt includes at least two shunts configured to have substantially the same electrical resistance.

2. The system of claim 1, further comprising a fastening device for securing the electrical shunt and the connection element to the terminal body.

3. The system of claim 1, further comprising a thermal device coupled to the electrical circuit and the terminal body, the thermal device being configured to respond to the temperature of the terminal body for the electrical circuit to determine a temperature of the terminal body.

4. The system of claim 3, wherein the thermal device is a thermal resistor.

5. The system of claim 1, further comprising a connector coupled to the electrical circuit, the connector enabling the transmission of electrical signals to and from the energy management system.

6. The system of claim 1, wherein the shunt is coupled to the terminal body through the use of at least one notch on the terminal body that is configured to receive the shunt.

7. The system of claim 1, wherein the terminal body includes at least one projection on an outer portion of the terminal body for thermal dissipation.

8. The system of claim 1, wherein the electrical circuit is configured to determine a voltage and a temperature of the energy storage device and the electrical circuit determines the predetermined parameters of the energy storage device based on the voltage and the temperature of the energy storage device.

9. A monitoring system for determining a parameter of an energy storage device used to provide power to one or more loads, the system comprising:
    an electrically conducting terminal body having a fastening element configured to connect to a terminal of the energy storage device;
    a shunt device having two separate, vertical shunts commonly terminating at a body portion, the two shunts being electrically connected to the terminal body and the body portion being electrically isolated from the terminal;

a connection element fastened directly to the body portion and in electrical communication with the one or more loads such that current flows from the terminal to the one or more loads by travelling through the terminal body and then through the two shunts and then through the body portion and finally through the connection element; and an electrical circuit coupled to the shunt, the electrical circuit being configured to determine predetermined the parameter of the energy storage device based on the flow of current through the electrical shunt.

10. The system of claim 9 wherein the terminal body includes a vertical side wall having separate notches within which ends of the two separate shunts are journaled to electrically connect to the terminal body.

11. An energy management system for a vehicle having an energy source configured to distributed electrical energy to a load, the system comprising:

a shunt having a unitary, U-shaped structure with two, separate blades at a first end that commonly terminate at an opposite, second end;

a terminal connected to the energy source and shaped to support both of the first and second ends of the shunt;

an insulator between the terminal and the second end of the shunt, the insulator being shaped to electrically isolate the second end of the shunt from the terminal;

a bracket connected to the second end of the shunt, the bracket completing a current path between the energy source and the load, the current path limiting current flow between the energy source and load such that current originating from the energy source must sequentially flow through the terminal, through both blades included at the first end of the shunt, through the second end of the shunt, and finally through the bracket before reaching the load; and a circuit supported by the terminal configured to measure a voltage drop across both the blades in order to parameters of the energy storage device as a function of current flow through the shunt.

12. The system of claim 11 wherein the terminal is U-shaped with a first leg extending away from a connection point to the energy storage device toward the first end of the shunt and a second leg extending away from the connection point toward the second end of the shunt.

13. The system of claim 12 wherein the first leg is shaped to include vertical notches that journal corresponding vertical ends of the blades.

14. The system of claim 13 wherein the second leg is shaped to support a flat, horizontal portion of the second end of the shunt at which the blades commonly terminate.

15. The system of claim 14 wherein a top side of the first leg is raised relative to a top side of the second leg.

16. The system of claim 15 wherein a top side of the first end of the shunt is planar with a top side of a second end of the shunt.

17. The system of claim 16 wherein the shunt includes a body portion dividing the vertical blades from the horizontal second end, the body portion extending above the top sides of the blades and the second end, the bracket being position above the second end and on a side below a top side of the body portion.

18. The system of claim 17 further comprising a fastener extending at least partially through and compressively securing each of the bracket, the insulator, the second end of the shunt, and the second leg of the terminal.

19. The system of claim 13 wherein the terminal includes projections on an outer side of the first leg proximately opposed to the notches to facilitate thermal dissipation.

20. The system of claim 1 wherein the energy storage device is a single battery such that wherein each of the shunts are connected to the same battery.

* * * * *